United States Patent [19]

Kaneko et al.

[11] 4,442,748

[45] Apr. 17, 1984

[54] FREQUENCY DIVIDER FOR ELECTRONIC MUSICAL INSTRUMENT

[75] Inventors: Makoto Kaneko, Hamakita; Takatoshi Okumura, Hamamatsu, both of Japan

[73] Assignee: Nippon Gakki Seizo Kabushiki Kaisha, Hamamatsu, Japan

[21] Appl. No.: 390,830

[22] Filed: Jun. 22, 1982

[30] Foreign Application Priority Data

Jun. 23, 1981 [JP] Japan .................................. 56-96943

[51] Int. Cl.³ ............................................ G10H 1/00
[52] U.S. Cl. ............................. 84/1.01; 84/DIG. 11; 377/52; 377/110
[58] Field of Search ................... 377/107, 110, 47, 49, 377/52; 84/1.01, DIG. 11; 328/14, 16

[56] References Cited

U.S. PATENT DOCUMENTS 3,614,632 10/1971 Leibowitz ........................... 377/107
4,333,374 6/1982 Okumura et al. .................... 84/1.01

Primary Examiner—Forester W. Isen
Attorney, Agent, or Firm—Spensley, Horn, Jubas & Lubitz

[57] ABSTRACT

A frequency divider which divides clock pulses to obtain the clock frequency of a desired dividing ratio comprises a binary counter, cycle data forming circuit and inhibit circuit to which the dividing ratio is fed in the form of the dividing ratio data.

The counter counts the clock pulses, and the cycle data forming circuit converts the count value of the binary counter to a cycle data in which a certain single bit only becomes a logical state "1" and the rest of the bits are a state "0". The bit which becomes "1" in the cycle data is uniquely determined by the count value. Further, each bit of the cycle data becomes "1" in proportion to the weight of the each bit. With the cycle data being thus formed, the dividing ratio data is simplified.

The inhibit circuit receives the cycle data and the dividing ratio data to suspend the counting operation of the binary count if the bit of the dividing ratio data corresponding to the bit of the cycle data whose state is "1" is also "1". This suspension enables the binary counter to perform a nonbinary counting operation, whereby the frequency-dividing based on the desired dividing ratio in the binary counter is implemented. By relating the diving ratio data to the pitch of a note, the frequency divider may be applicable to an electronic musical instrument.

13 Claims, 6 Drawing Figures

FREQUENCY DIVIDER FOR ELECTRONIC MUSICAL INSTRUMENT

BACKGROUND OF THE INVENTION

1. Field of the Invention

The present invention relates to a frequency divider for obtaining signals corresponding to the dividing ratio indicated by dividing ratio data, and in particular to a frequency divider applicable to such circuits as a tone source circuit in an electronic musical instruments, etc.

2. Description of the Prior Art

To obtain a tone source signal corresponding to the pitch of a musical tone to be produced, a frequency divider for dividing a master clock pulse of a predetermined frequency is employed in the tone source circuit of an electronic musical instrument. For a prior art frequency divider of the above type, its dividing ratio must be set at a considerably large value so as to minimize frequency error (cent error) of each tone source signal obtained by the division, and the circuit composition for the divider has become unfavorably complicated.

SUMMARY OF THE INVENTION

In view of the foregoing, an object of the present invention is to provide a frequency divider of a simple composition capable of providing a divided output of a large dividing ratio.

Another object of the present invention is to provide a frequency divider capable of attaining the simplification of the system for an electronic musical instrument when the divider is used as a tone source circuit.

According to the present invention, a cycle data is formed in which a signal "1" is generated at a single bit only based on the output of a counter driven by a predetermined clock pulse, and the ratio at which the above signal "1" generates corresponds to the weight of each bit. The cycle data and dividing ratio data are compared for each corresponding bits, and when a signal "1" occurs at a corresponding bit in each data, counting operation of the counter is suspended for one count, whereby the dividing output corresponding to the dividing ratio data is obtained from the output of the counter.

The present invention will now be described in detail in connection with the accompanying drawing in which presently preferred embodiments of the invention are illustrated by way of example.

BRIEF DESCRIPTION OF THE DRAWINGS

In the accompanying drawings

DETAILED DESCRIPTION OF THE PREFERRED EMBODIMENT

Figure 1:
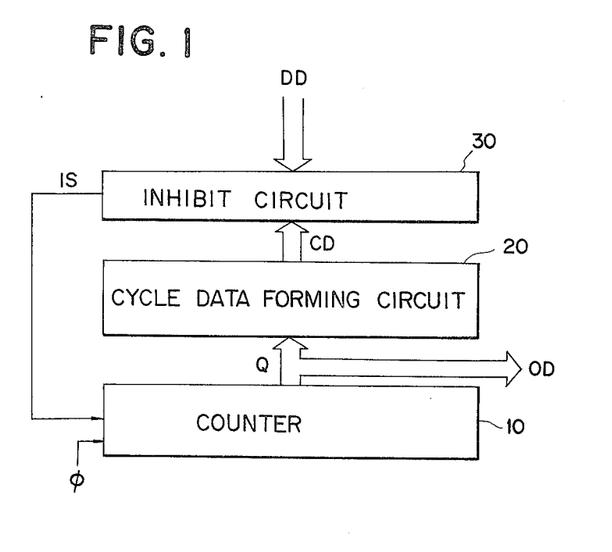
FIG. 1 is a block diagram showing the outline of the divider according to the present invention.

Referring to FIG. 1, a counter 10 is a binary counter (preferably a synchronous type counter) driven by a predetermined clock pulse $\phi$. A count output Q of the counter 10 is applied to a cycle data forming circuit 20. The cycle data forming circuit 20 forms a cycle data CD in which the content of only one bit becomes "1", and the ratio at which the content of each bit becomes "1" corresponds to the weight of each bit. In order to facilitate the understanding of said cycle data CD, an example of the cycle data CD in which the number of bits of the counter 10 is four is shown in Table 1.

TABLE 1

| Counter Output Q | | | | Cycle data CD | | | | |
|---|---|---|---|---|---|---|---|---|
| $Q_4$ | $Q_3$ | $Q_2$ | $Q_1$ | $CD_4$ | $CD_3$ | $CD_2$ | $CD_1$ | |
| 0 | 0 | 0 | 0 | 0 | 0 | 0 | 0 | |
| 0 | 0 | 0 | 1 | 1 | 0 | 0 | 0 | * |
| 0 | 0 | 1 | 0 | 0 | 1 | 0 | 0 | |
| 0 | 0 | 1 | 1 | 1 | 0 | 0 | 0 | * |
| 0 | 1 | 0 | 0 | 0 | 0 | 1 | 0 | * |
| 0 | 1 | 0 | 1 | 1 | 0 | 0 | 0 | * |
| 0 | 1 | 1 | 0 | 0 | 1 | 0 | 0 | |
| 0 | 1 | 1 | 1 | 1 | 0 | 0 | 0 | * |
| 1 | 0 | 0 | 0 | 0 | 0 | 0 | 1 | * |
| 1 | 0 | 0 | 1 | 1 | 0 | 0 | 0 | * |
| 1 | 0 | 1 | 0 | 0 | 1 | 0 | 0 | |
| 1 | 0 | 1 | 1 | 1 | 0 | 0 | 0 | * |
| 1 | 1 | 0 | 0 | 0 | 0 | 1 | 0 | * |
| 1 | 1 | 0 | 1 | 1 | 0 | 0 | 0 | * |
| 1 | 1 | 1 | 0 | 0 | 1 | 0 | 0 | |
| 1 | 1 | 1 | 1 | 1 | 0 | 0 | 0 | * |

Referring to Table 1, Q4–Q1 show bits of the count output Q of the counter 10, while CD4–CD1 show bits of the cycle data CD formed by the cycle data forming circuit 20. That is, the cycle data CD4–CD1 shown in Table 1 are repeatedly generated by the cycle data forming circuit 20 in response to the count outputs Q4–Q1. Out of the bits of the cycle data $CD_1$ through $CD_4$, any one, and only one, of them becomes "1" and the ratio at which each bit $CD_4$–$CD_1$ becomes "1" are 8:4:2:1, that is, the ratio corresponds to the weights of respective bits "8", "4", "2" and "1".

The cycle data CD generated at the cycle data forming circuit 20 is fed to an inhibit circuit 30. At the same time, a dividing ratio data DD representing dividing ratio is applied to the inhibit circuit 30. This dividing ratio data DD is a binary data composed of the same number of bits as the cycle data CD. The inhibit circuit 30 compares the cycle data CD fed from the cycle data forming circuit 20 with the dividing ratio data DD for each corresponding bits, generates an inhibit signal IS when corresponding bits are "1" simultaneously, and suspends the counting operation of the counter 10 for one count. For example, when the dividing ratio data DD is "0000" and the cycle data CD are as shown in Table 1, the values of the corresponding bits of the cycle data CD and the dividing ratio data DD do not become "1" simultaneously within one cycle of the cycle data CD (CD4–CD1). Accordingly, the counter 10 operates, without being suspended, with one cycle being $16 \times \phi_p$ where $\phi_p$ is a period of the clock pulse $\phi$. On the other hand, when the dividing ratio data DD is, for example, "1011", the inhibit signal IS is generated at the inhibit circuit 30 each time the cycle data CD becomes the values indicated by * mark in Table 1, and the counting operation of the counter 10 is suspended for one count by this signal IS. Accordingly, one cycle of the counter 10 is extended by $8 \cdot \phi_p + 2 \cdot \phi_p + \phi_p = 11 \cdot \phi_p$ and the counter 10 operates with a cycle of $27 \cdot \phi_p$.

The relation between the dividing ratio data DD and cycle T of the counter 10, when the dividing ratio data DD is composed of 4 bits DD4–DD1 in the case that the number of bits of both the counter 10 and the cycle data CD is four, can be expressed by the following general equation:

$$T = (2^4 + DD_4 \times 2^3 + DD_3 \times 2^2 + DD_2 \times 2 + DD_1) \times \phi_p \qquad (1)$$

The above relation is summed up as shown in Table 2.

TABLE 2

| Dividing ratio data DD | | | | Cycle T of counter 10 |
|---|---|---|---|---|
| DD$_4$ | DD$_3$ | DD$_2$ | DD$_1$ | |
| 0 | 0 | 0 | 0 | 16 · $\phi_p$ |
| 0 | 0 | 0 | 1 | 17 · $\phi_p$(= 16 + 1) |
| 0 | 0 | 1 | 0 | 18 · $\phi_p$(= 16 + 2) |
| 0 | 0 | 1 | 1 | 19 · $\phi_p$(= 16 + 2 + 1) |
| 0 | 1 | 0 | 0 | 20 · $\phi_p$(= 16 + 4) |
| 0 | 1 | 0 | 1 | 21 · $\phi_p$(= 16 + 4 + 1) |
| 0 | 1 | 1 | 0 | 22 · $\phi_p$(= 16 + 4 + 2) |
| 0 | 1 | 1 | 1 | 23 · $\phi_p$(= 16 + 4 + 2 + 1) |
| 1 | 0 | 0 | 0 | 24 · $\phi_p$(= 16 + 8) |
| 1 | 0 | 0 | 1 | 25 · $\phi_p$(= 16 + 8 + 1) |
| 1 | 0 | 1 | 0 | 26 · $\phi_p$(= 16 + 8 + 2) |
| 1 | 0 | 1 | 1 | 27 · $\phi_p$(= 16 + 8 + 2 + 1) |
| 1 | 1 | 0 | 0 | 28 · $\phi_p$(= 16 + 8 + 4) |
| 1 | 1 | 0 | 1 | 29 · $\phi_p$(= 16 + 8 + 4 + 1) |
| 1 | 1 | 1 | 0 | 30 · $\phi_p$(= 16 + 8 + 4 + 2) |
| 1 | 1 | 1 | 1 | 31 · $\phi_p$(= 16 + 8 + 4 + 2 + 1) |

That is, in this case, cycle T of counter 10 can be varied over the range from 16·$\phi_p$ to 31·$\phi_p$ in response to the contents of the dividing ratio data DD4–DD1. Generally, when the number of bits of the counter 10 is N and the dividing ratio data DD is composed of "N" bit DDN–DD1, cycle T of the counter 10 is expressed by the following general equation, $$T = \left\{ 2^N + \sum_{K=0}^{N-1} (CD_{N-K} \times 2^{N-k-1}) \right\} \times \phi_p \qquad (2)$$

The counter 10 will operate with the cycle from 2·$\phi_p$ to $(2^{N=1}-1) \times \phi_p$ corresponding to the content of the dividing ratio data DNN–DD1.

In this manner, cycle T of the counter 10 varies in response to the dividing ratio data DD, and as a result the count output Q of the counter 10 varies at a speed corresponding to the signal resulted from dividing the clock pulse $\phi$ at a dividing ratio corresponding to the dividing ratio data DD. The count output Q of the counter 10 is output as output data OD.

Figure 2:
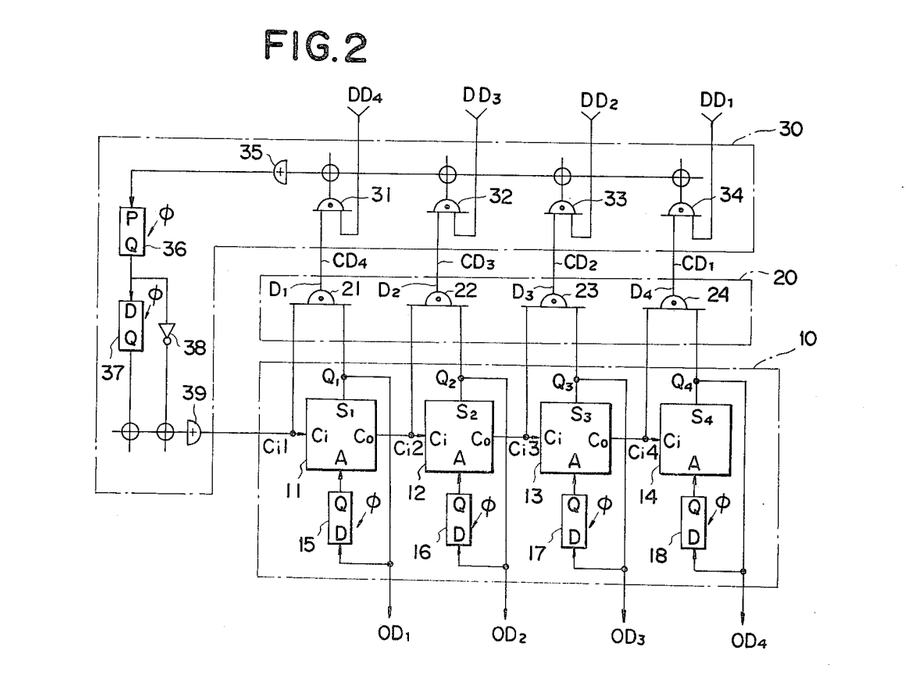
FIGS. 2 through 4 are circuit diagrams showing an embodiment of the divider according to the present invention.

Referring now to FIG. 2, the counter 10 of this embodiment is comprised of four adders 11–14, and four delay flip-flops 15–18. Each combination of the adder 11 and delay flip-flop 15, the adder 12 and delay flip-flop 16, the adder 13 and delay flip-flop 17, and the adder 14 and delay flip-flop 18 forms an adder circuit executing adding operation synchronized with the clock pulse $\phi$. The counter 10 is constructed as a 4-bit binary synchronous type counter with four such adders connected in series. When a signal applied to a carry input Ci of the adder 11 which corresponds to the first bit (the least significant bit) is "1", the counter 10 performs counting synchronized with the clock pulse $\phi$, and stops counting when the above signal becomes "0".

The cycle data forming circuit 20 consists of four 2-input AND circuits 21–24, wherein fed to each AND circuit 21–24 are both the signal applied to the carry inputs Ci of the adder 11–14 and the adder outputs S1–S4 (count output Q1–Q4), respectively.

In the case that signal Ci1–Ci4 are applied to the carry input Ci of individual adders 11–14 of the counter 10 respectively, and the signal Ci1 is "1" (as mentioned later, the signal Ci1 is "1" during the period when a predetermined condition is not established at the inhibit circuit 30), the operation of the counter 10 and signals D1–D4 generating at AND circuits 21–24 in response to the counter operation will be as shown in Table 3.

TABLE 3

| Ci$_1$ | S$_1$ | Ci$_2$ | S$_2$ | Ci$_3$ | S$_3$ | Si$_4$ | S$_4$ | D$_1$ | D$_2$ | D$_3$ | D$_4$ |
|---|---|---|---|---|---|---|---|---|---|---|---|
| 1 | 0 | 0 | 0 | 0 | 0 | 0 | 0 | 0 | 0 | 0 | 0 |
| 1 | 1 | 0 | 0 | 0 | 0 | 0 | 0 | 1 | 0 | 0 | 0 |
| 1 | 0 | 1 | 1 | 0 | 0 | 0 | 0 | 0 | 1 | 0 | 0 |
| 1 | 1 | 0 | 1 | 0 | 0 | 0 | 0 | 1 | 0 | 0 | 0 |
| 1 | 0 | 1 | 0 | 1 | 1 | 0 | 0 | 0 | 0 | 1 | 0 |
| 1 | 1 | 0 | 0 | 1 | 0 | 0 | 0 | 1 | 0 | 0 | 0 |
| 1 | 0 | 1 | 1 | 1 | 0 | 0 | 0 | 0 | 1 | 0 | 0 |
| 1 | 1 | 0 | 1 | 1 | 0 | 0 | 1 | 0 | 0 | 0 | 0 |
| 1 | 0 | 1 | 0 | 1 | 0 | 1 | 1 | 0 | 0 | 0 | 1 |
| 1 | 1 | 0 | 0 | 0 | 0 | 1 | 1 | 0 | 0 | 0 | 0 |
| 1 | 0 | 1 | 1 | 0 | 0 | 1 | 0 | 1 | 0 | 0 | 0 |
| 1 | 1 | 0 | 1 | 0 | 0 | 1 | 1 | 0 | 0 | 0 | 0 |
| 1 | 0 | 1 | 0 | 1 | 1 | 0 | 0 | 1 | 0 | 0 | 0 |
| 1 | 1 | 0 | 0 | 1 | 0 | 1 | 1 | 0 | 0 | 0 | 0 |
| 1 | 0 | 1 | 1 | 1 | 0 | 1 | 0 | 1 | 0 | 0 | 0 |
| 1 | 1 | 0 | 1 | 1 | 0 | 1 | 1 | 0 | 0 | 0 | 0 |

As evident from Table 3, the output signals D1–D4, of the AND circuits 21–24 correspond to bits CD4–CD1 of the cycle data CD shown in Table 1, respectively. The output signals D1–D4 are applied to the inhibit circuit 30 as the cycle data CD4–CD1.

The inhibit circuit 30 is provided with four 2-input AND circuits 31–34, and to the AND circuits 31–34 are applied both corresponding bits of the cycle data CD4–CD1 output from the AND circuits 21–24 of the cycle data forming circuit 20 and the dividing ratio data DD4–DD1 specifying dividing ratio of frequency division. The outputs of these AND circuits 31–34 are fed to an OR circuit 35. Accordingly, when corresponding bits in each of the cycle CD4–CD1 and the dividing ratio data DD4–DD1 become "1" simultaneously, the output of OR circuit 35 changes from "0" to "1", which is fed to an OR circuit 39 through a delay flip-flop 36, and an inverter 38. The output of the delay flip-flop 36 is also fed to the OR circuit 39 via a delay flip-flop 37. As a result, when it happens that a certain corresponding bit in each of the cycle data CD4–CD1 and the dividing ratio data DD4–DD1 becomes "1", a signal whose value is "0" only during the next count timing of the counter 10 is generated. This signal is fed to the carrying input Ci of the adder 11 of the counter 10. That is, when a certain corresponding bit "1" in each of the cycle data CD4–CD1 and the dividing ratio data DD4–DD1 is "1", subsequent counting operation of the counter 10 is inhibited by one count.

In this manner, a dividing signal with dividing ratio corresponding to the dividing ratio data CD4–CD1 can be obtained from the output S1–S4 of the adder 11–14 of the counter 10.

Figure 3:
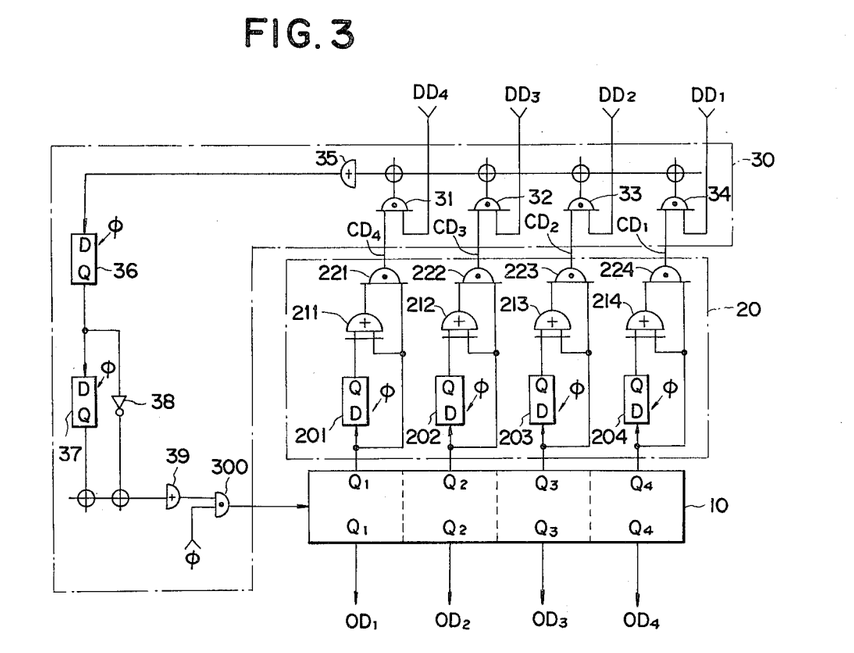

Referring now to FIG. 3 another embodiment is shown which differs greatly from the embodiment shown in FIG. 2 in that this embodiment employs an ordinary binary counter as the counter 10 and the clock pulse $\phi$ to be fed to the counter 10 is inhibited by the inhibit circuit 30 for inhibiting count operation of the counter 10. Furthermore, a different configuration is used for the cycle data forming circuit 20. However the basic operation is totally identical between these two embodiments. Accordingly, description is simplified by using the same reference numbers and symbols as those of the circuits shown in FIG. 2.

The counter 10 is driven by the clock pulse $\phi$ applied through an AND circuit 300 of the inhibit circuit 30, and count output Q (Q1–Q4) is fed to the cycle data forming circuit 20. The cycle data forming circuit 20 includes four delay flip-flops 201–204, exclusive OR circuit 211–214, and AND circuits 221–224. The operation of the cycle data forming circuit 20 will be described in conjunction with the flip-flop 201, the OR circuit 211 and the AND circuit 221 which correspond to the first bit. The output Q1 at the first of the counter 10, and a signal which is formed by delaying the output Q1 by one cycle of the clock pulse $\phi$ (i.e. the output Q1 at one count operation before) are compared by applying both to the exclusive OR circuit 211, and if the values of the two signals differ, the AND circuit 221 outputs a signal provided that the output Q1 of the counter 10 is "1". Thus, only when the output Q1 has changed from "0" to "1", the output of the AND circuit 221 becomes "1". To other bits, the same operation takes place. In such composition, the relation between the input and output of the cycle data forming circuit 20 becomes identical with that of the cycle data forming circuit 20 shown in FIG. 2. That is, the cycle data forming circuit 20 generates the cycle data CD4–CD1 shown in Table 1 in response to the count value of the counter 10. The cycle data CD4–CD1 and the dividing ratio data DD4–DD1 are compared for each corresponding bit at the AND circuits 31–34 of the inhibit circuit 30, and when it happens that a certain corresponding bit becomes "1" simultaneously both in the cycle data CD4–CD1 and the dividing ratio data DD4–DD1, a signal "1" is output from the OR circuit 35. This signal "1" is fed to the OR circuit 39 through the flip-flop 36 and the inverter 38, the AND circuit 300 is made inoperative by the output of the OR circuit 39 during the next count timing of the counter 10, and the counter 10 is inhibited to perform count operation by one count.

Figure 4:
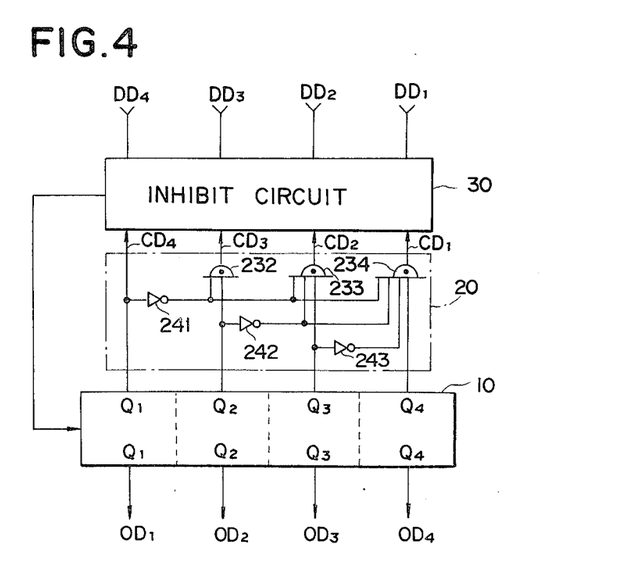

Referring to FIG. 4, the third embodiment is shown in which the cycle data forming circuit 20 of different configuration is used. The cycle data forming circuit 20 in this embodiment is comprised of three AND circuits 232, 233, and 234, and three inverters 241, 242, and 243. The cycle data forming circuit 20 operates in such a way that the first bit output Q1 of the counter 10 is directly output as data CD4, the second bit output Q2 is output as data CD3 via the AND circuit 232 provided that the first bit output Q1 of the counter 10 is "0", the third bit output Q3 is output as data CD2 via the AND circuit 233 provided that both the first and the second bit outputs Q1 are Q2 and "0", and the fourth bit output Q4 is output as data C1 via the AND circuit 234 provided that the first to third bit output Q1 to Q3 are "0". Such configuration can provide the same signal as the cycle data CD4–CD1 shown in Table 1, and the same operation as those of the embodiments shown in FIGS. 2 and 3 can be obtained. For the counter 10 and the inhibit circuit 30 shown in FIG. 4, the same configuration as the same numbered counter 10 and the inhibit circuit 30 of FIGS. 2 and 3 is employed.

Though the embodiments shown in FIG. 2 through FIG. 4 are in 4-bit configuration, configuration with any desired number of bits may also be employed. The configuration of the cycle data forming circuit 20 is not limited to that described above. What is required of the cycle data forming circuit 20 is that a signal occurs at an optional bit only in response to the count output Q of the counter 10, and that a cycle data CD wherein the ratio at which a signal occurs at each bit corresponds to the weight of each bit. The counter 10 may be of a variety of configurations of synchronous or asynchronous type. Further, the operation suspension means of the counter 10 by the use of the inhibit circuit 30 is not limited to the configuration shown in the above-mentioned embodiments. For example, the operation of the counter 10 can be suspended substantially by presetting the same content as the current count value. Further, although the number of count operation of the counter 10 to be inhibited by the inhibit circuit 30 is one in any of the aforementioned embodiments, more than one count may be inhibited. Further still, the AND circuits 21–24 (221–224) of the cycle data forming circuit 20, and the AND circuits 31–34 of the inhibit circuit 30 may be combined into 3-input AND circuits.

Figure 5:
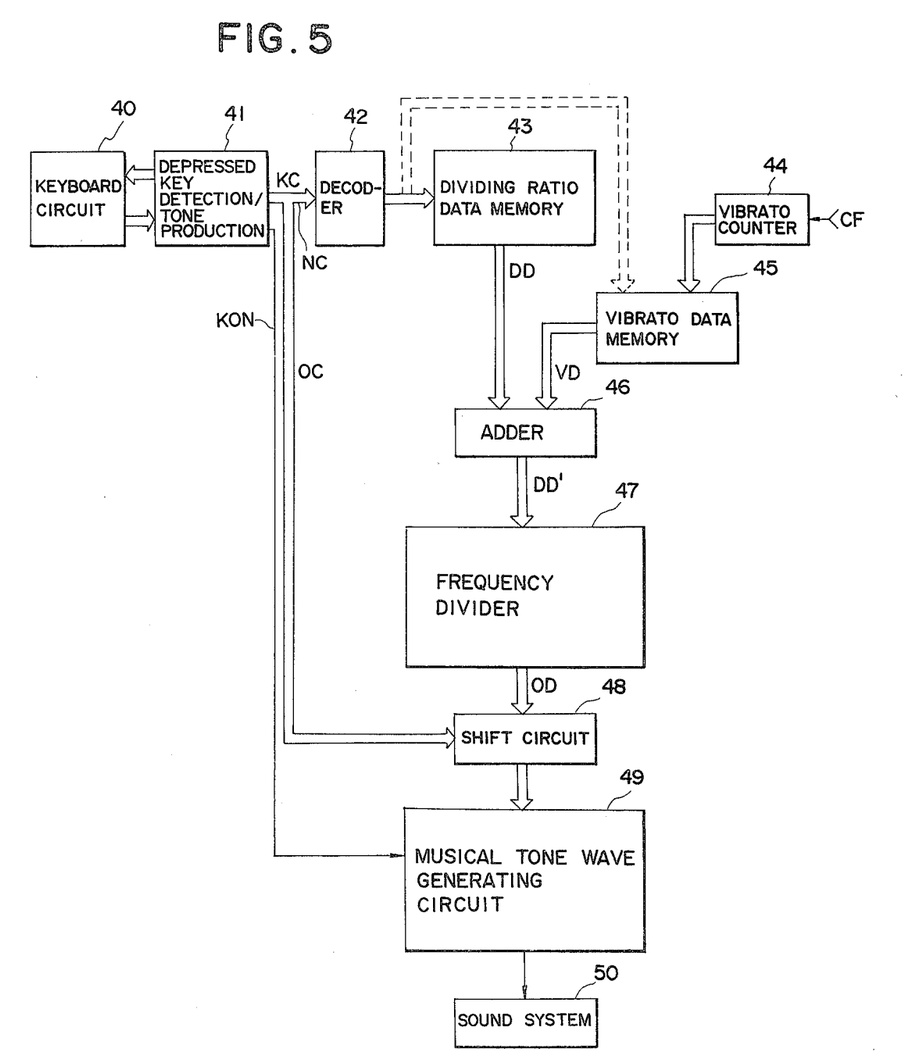
FIG. 5 is a block diagram showing an example of the electronic musical instrument employing the divider according to the present invention.

FIG. 5 shows an example of and electronic musical instrument to which the frequency divider according to the present invention is applied. A keyboard circuit 40 is provided with key switches corresponding to individual keys of the keyboard, and a depressed key detection/tone production assignment circuit 41 assigns a key code KC identifying the not to be produced to available one of the tone production channels which correspond to the number of the maximum simultaneous tone productions N by detecting the state (ON or OFF) of each key switch of the keyboard circuit 40. Each tone production channel is a time division channel wherein a specific time slot is designated, and the key code KC identifying the note to be produced and the key-on signal KON indicating the depressed state of said key are assigned to the time slot corresponding to each tone production channel, being output on the time division basis. The key code KC output from the depressed key detection/tone production assignment circuit 41 is comprised of a note code NC inidicating note name of the note to be produced, and an octave code OC indicating octave region of the note, and the note code NC is fed to a dividing ratio data memory 43 via a decoder 42, while the octave code OC being fed to a shift circuit 48.

The dividing ratio data memory 43 stores twelve dividing ratio data DD corresponding to twelve note name C# through C. In this embodiment, 7-bit data DD7–DD1 is used for the dividing ratio data DD. An example of the dividing ratio data DD with respect to each note name is as shown in Table 4.

TABLE 4

| Note name | Dividing ratio data DD | | | | | | |
|---|---|---|---|---|---|---|---|
| | $DD_7$ | $DD_6$ | $DD_5$ | $DD_4$ | $DD_3$ | $DD_2$ | $DD_1$ |
| C# | 1 | 1 | 1 | 0 | 1 | 1 | 0 |
| D | 1 | 1 | 0 | 1 | 0 | 0 | 0 |
| D# | 1 | 0 | 1 | 1 | 0 | 1 | 1 |
| E | 1 | 0 | 0 | 1 | 1 | 1 | 1 |
| F | 1 | 0 | 0 | 0 | 0 | 1 | 1 |
| F# | 0 | 1 | 1 | 1 | 0 | 0 | 0 |
| G | 0 | 1 | 0 | 1 | 1 | 1 | 0 |
| G# | 0 | 1 | 0 | 0 | 1 | 0 | 0 |
| A | 0 | 0 | 1 | 1 | 0 | 1 | 1 |
| A# | 0 | 0 | 1 | 0 | 0 | 1 | 0 |
| B | 0 | 0 | 0 | 1 | 0 | 1 | 0 |
| C | 0 | 0 | 0 | 0 | 0 | 1 | 0 |

In response to a signal indicating the note name of the note assigned to each tone production channel which is output from a decoder 41 in time division manner, the dividing ratio data memory 45 reads out the dividing ratio data DD (DD7–DD1) corresponding to the note name in time division manner, and applies it to an adder 46.

In this embodiment, in order to give a specified vibrator to the produced musical tone, a vibrato counter 44 and a vibrator data memory 45 are provided. The vibrator data memory 45 stores vibrato data VD for performing the vibrator (to increase or decrease the dividing ratio data DD by a value corresponding to the vibrato waveform) of the dividing ratio data DD. The vibrato data memory 44 reads out the vibrato data VD by using the vibrato counter 44 driven by a clock pulse CP corresponding to the vibrato speed as an address counter, and applies the vibrator data VD thus read to the adder 46. The vibrato data memory 45 can be designed so as to store the vibrato data VD which differs according to the note name, and to be addressed by both the output of the decoder 42 indicating the note name and the output of the vibrato counter 44. In this case, the vibrato data VD which differs according to the note name is read out from the vibrato data memory 45. The vibrato memory 45 also operates at the time slot corresponding to the tone production channel in time division manner.

The dividing ratio data DD output from the dividing ratio data memory 43 is added to the vibrato data VD outputted from the vibrato data memory 45 at the adder 46, and the resulting data is fed to a frequency divider 47 as a dividing ratio data DD' (DD'7–DD'1).

Figure 6:
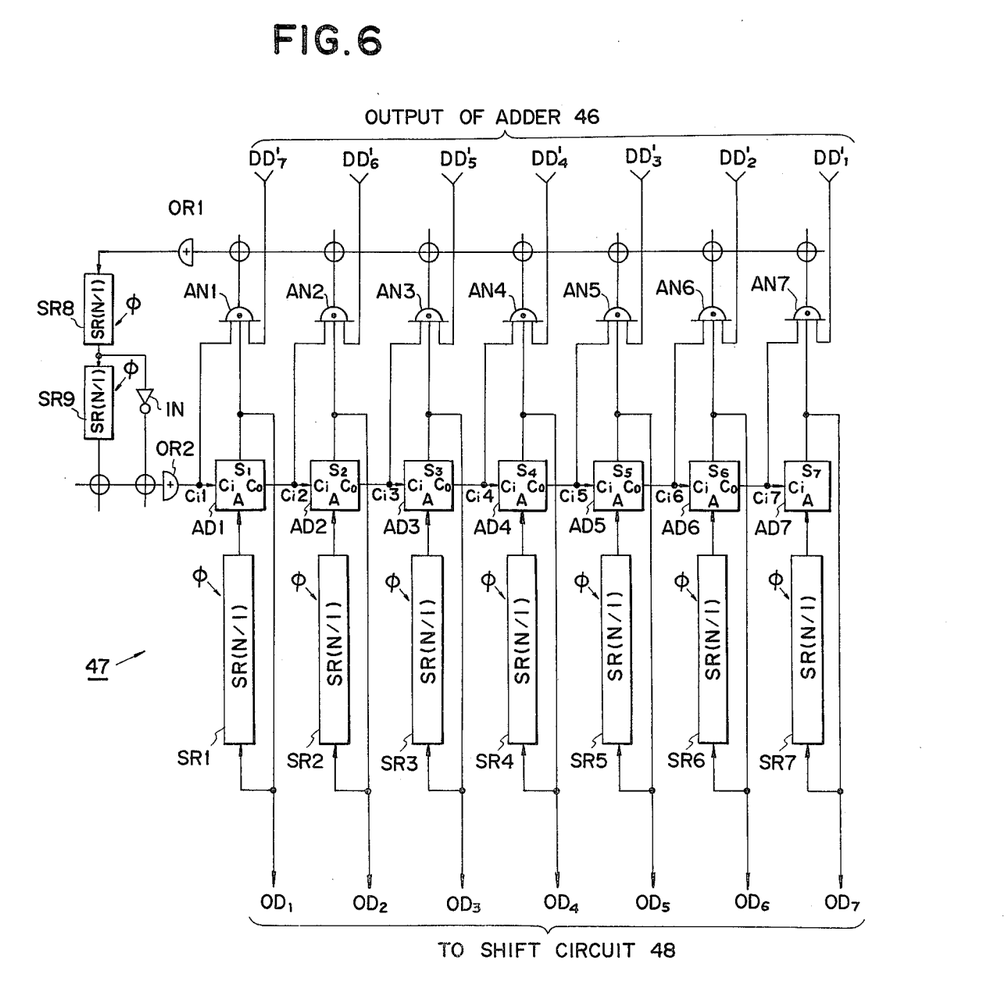
FIG. 6 is a circuit diagram showing the detail of the divider of FIG. 5.

The divider 47 according to the present invention forms a divided output OD (OD7–OD1) corresponding to the dividing ratio data DD'. This divider is detailed in FIG. 6. The divider 47 shown in FIG. 6 is identical to the circuit shown in FIG. 2 except that the number of bits of the former is seven, and that the operations are performed in time division manner corresponding to the tone production channels (time slots) number of which is as many as N. That is, the circuit shown in FIG. 6 comprises nine N-stage 1-bit shift registers SR1–SR9 to be driven by the clock pulse $\phi$, adders AD1–AD7, 3-input AND circuits AN1–AN7, OR circuits OR1–OR2 and an inverter IN. In this circuit, a time division counter is formed by the shift registers SR1–SR7 and the adders AD1–AD7, the cycle data forming circuit and one part of the inhibit circuit are formed by the 3-input AND circuits AN1–AN7, and the other part of the inhibit circuit is formed by the OR circuits OR1–OR2, the shift registers SR8–SR9 and the inverter IN. The operation of this circuit is now described briefly. The circuit composed of the shift registers SR1–SR7 and the adders AD1–AD7 performs count operation by the clock pulse $\phi$ in time division manner. Accordingly, if a particular channel is observed, the circuit performs count operation synchronized with a clock pulse whose cycle is $N \cdot \phi_p$. The time width of the time slot of each tone production channel is designed to be equal to one cycle time of the clock pulse. Outputs S1–S7 of the adders AD1–AD7, and signals Ci1–Ci7 to be fed to the carry input Ci become input signals to be fed into two inputs of the 3-input AND circuits AN1–AN7, respectively. Fed to the remaining input of each AND circuit AN1–AN7 is the dividing ratio data DD'7–DD'1 output from the adder 46. Accordingly, among the AND circuits AN1–AN7, AND condition is established only at the AND circuits whose corresponding bits in the dividing ratio data DD'7–DD'1 are "1". The ratio at which AND condition is established corresponds to the weight of the bit. The AND circuits in which AND condition is established output the signal "1". This signal is fed to the shift register SR8 via the OR circuit OR1, and the output of the shift register SR8 is fed to the OR circuit OR2 through the inverter IN and the shift register SR9. The output of this OR circuit OR2 controls the count operation of a counter comprised of the shift registers SR1–SR7 and the adders AD1–AD7.

The count output (the output of the shift register SR1–SR7) of the counter which comprises the shift registers SR1–SR7, and the adders AD1–AD7 whose count operation is controlled in response to the dividing ratio data DD7–DD1, is output as the divided output OD (OD1–OD7). The cycle To of this divided output OD can be given as follows, if the dividing ratio data DD'7–DD'1 is, for example, "1001111".

$$To = (2^7 + 1 \times 2^6 + 1 \times 2^3 + 1 \times 2^2 + 1 \times 2^1 + 1 \times 2^0) N \cdot \phi_p \quad (3)$$

Thus the cycle of the divided output OD corresponds to the dividing ratio data DD'7–DD'1.

The divided output OD formed at the divider 47 is fed to a shift circuit 48, and shift-controlled in response to the octave code OC output from the tone production assignment circuit 41. As a result of this shift control, a signal whose frequency corresponds to the octave region of the tone to be produced, i.e., a cycle signal corresponding to the tone to be produced, is formed.

A musical tone waveform generating circuit 49 receives the key-on signal KON output from the depressed key detection/tone production assignment circuit 41, forms a musical tone signal indicating the tone to be produced, and applies the signal thus produced to a sound system 50, causing it to produce a musical tone. A variety of known circuits such as those employing the waveform memory system and the frequency modulation system may be used as the musical tone waveform generating circuit 49. When the waveform memory system is used in the musical tone waveform generating circuit 49, the musical tone waveform generating circuit 49 can be simplified, since the output of the shift circuit 48 can be used directly as an address signal of the waveform memory.

In the system shown in FIG. 5, the shift circuit 48 may be replaced with an octave selector for selecting a predetermined bit signal of the output the divider 47, and the output of the octave selector (square wave tone source signal) is taken as a tone source signal, on the basis of which a musical tone signal is formed.

As has been described above, a divider capable of giving a high dividing ratio by a simple configuration can be realized according to the present invention, and in particular, when the divider is used as a tone source circuit of the electronic musical instrument, a favorable effect can be obtained for the simplication of the system.

What is claimed is:

1. A frequency divider for use in an electronic musical instrument comprising:
   counter means driven by a predetermined clock pulse for producing a plural-bit count output, said count output having a certain number of different possible values;
   cycle data forming means for forming, for each value of count output from said counter means, a certain plural-bit cycle data value in which only a specific single bit is in a first binary state and the rest of the bits are in a second binary state, whereby a certain cycle data value is formed for selected ones of said certain number of different count output possible values, the ratio of the number of cycle data values having a particular specific single bit in a first binary state to the total number of possible different count output values being proportional to the binary significance of said particular certain single bit; and inhibit means for comparing a plural-bit dividing ratio data representative of a dividing ratio with said cycle data for every corresponding bit and for inhibiting counting operation of said counter means when corresponding bits of said dividing ratio data and said cycle data are first states, whereby dividing data is obtained from the output from said counter means.

2. The frequency divider of claim 1 wherein said first binary state is binary 1, said second binary state is binary 0, and said certain number of different possible count output values is $2^n$ where n is the number of bits of said count output.

3. A frequency divider as defined in claim 2, wherein said counter means includes a plurality of plural-bit addition circuits connected to each other in series, and said cycle data forming means includes a plurality of AND gates.

4. A frequency divider as defined in claim 3 wherein each of said addition circuits includes a carry input for receiving a carry input signal and an output for an addition output signal and said AND gates perform the logical AND function on said carry input signal and said addition output signal.

5. A frequency divider as defined in claim 4, wherein each of said addition circuits adds the prior contents of said each addition circuit to a signal fed into the carry input thereof synchronized with said clock pulse.

6. A frequency divider as defined in claim 1, wherein said cycle data forming means includes:
a plurality of delay flip-flops for respectively delaying the output of said counter means for each bit;
a plurality of EXCLUSIVE-OR gates for respectively performing EXCLUSIVE-OR operation on the output of said delay flip-flop circuit and the output of said counter means for each bit; and
a plurality of AND gates for performing AND operation on the output of said EXCLUSIVE-OR gate and the output of said counter means for each bit.

7. A frequency divider as defined in claim 1, wherein said cycle data forming means includes:
a plurality of AND gates provided corresponding to each bit of said counter means except the least significant bit, one input and said AND gates respectively receiving the output of said counter means for each bit except the least significant bit; and
a plurality of INVERTER gates provided corresponding to each bit of said counter means except the most significant bit for inverting the output of said each bit so as to feed the inverted output into the other input of said AND gate of one bit higher than said each bit.

8. A frequency divider as defined in claim 1, wherein said inhibit means includes a plurality of AND gates for performing AND operation on said dividing ratio data and said cycle data with respect to each corresponding bit thereof;
an OR gate for performing OR operation on the output of said AND gates; and
a suspension circuit for suspending counting operation of said counter means in response to the output of said OR gate.

9. A frequency divider as defined in claim 8, wherein said suspension circuit is a circuit for inhibiting the carry input signal from feeding into the carry input of said addition circuit corresponding to the least significant bit of said counter means.

10. A frequency divider for producing polyphonic sounds in an electronic musical instrument comprising:
a counter comprising a plurality of addition circuits connected to each other in series,
a plurality of first N-stage shift registers respectively provided corresponding to each of said addition, circuits for supplying output signals of said addition circuits to an input thereof after delaying said output signals by N clock cycles, N being a positive integer larger than 1,
means for generating N dividing ratio data bite
inhibit means for outputting an inhibit signal when a carry input signal and the corresponding output signal of at least one of said addition circuits and a bit corresponding to said one of said addition circuits of said dividing ratio data are all logically 1, and
a second N-stage shift register provided between said inhibit means and said counter for supplying said inhibit signal into an input of said counter so as to suspend counter operation of said counter.

11. The method of dividing the frequency of a high frequency clock signal including the steps:
counting the pulses from a predetermined high frequency clock signal to form a binary count output for each counting step;
forming plural bit cycle data from each binary count output such that said cycle data has only one bit at binary value 1 and the ratio at which each bit becomes binary value 1 over several successive binary count outputs is proportional to the significance of said bit;
comparing each bit of said cycle data with each corresponding bit of externally input dividing ratio data;
inhibiting said counting operation for at least one counting step when said cycle data and said dividing ratio data have corresponding bits at logic level 1.

12. The method of claim 11 wherein the set of steps of counting, forming, comparing, and inhibiting is performed separately on a plurality of channels on a time division multiplex basis to provide a different frequency for each of said plurality of channels.

13. An electronic musical instrument comprising:
a keyboard circuit having a plurality of keyswitches for producing a key code corresponding to an operated keyswitch,
a dividing ratio data memory for storing a dividing ratio data corresponding to said key code,
a frequency divider for producing a frequency divided data corresponding to said dividing ratio data, said frequency divider comprising: counter means driven by a predetermined clock pulse for producing a plural-bit count output, said count output having a certain number of different possible values; cycle data forming means for forming, for each value of count output from said counter means, a certain plural-bit cycle data value in which only a specific single bit is in a first binary state and the rest of the bits are in a second binary state, whereby a certain cycle data value is formed for selected ones of said certain number of different count output possible values, the ratio of the number of cycle data values having a particular specific single bit in a first binary state to the total number of possible different count output values being proportional to the binary significance of said particular certain single bit; and inhibit means for inhibiting counting operation of said counter means when corresponding bits of said dividing ratio data and said cycle data are the first state, and a sound system for forming a musical tone signal in response to output of said frequency divider so as to produce a musical tone.

* * * * *